(12) United States Patent
Mishra et al.

(10) Patent No.: US 8,242,854 B2
(45) Date of Patent: Aug. 14, 2012

(54) ENHANCING DEVICE RELIABILITY FOR VOLTAGE CONTROLLED OSCILLATOR (VCO) BUFFERS UNDER HIGH VOLTAGE SWING CONDITIONS

(75) Inventors: Chinmaya Mishra, San Diego, CA (US); Rajagopalan Rangarajan, San Diego, CA (US); Hongyan Yan, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 39 days.

(21) Appl. No.: 12/825,221

(22) Filed: Jun. 28, 2010

(65) Prior Publication Data

US 2010/0327986 A1 Dec. 30, 2010

Related U.S. Application Data

(60) Provisional application No. 61/222,064, filed on Jun. 30, 2009.

(51) Int. Cl.
*H03B 5/12* (2006.01)
*H03L 5/00* (2006.01)
*H03K 17/16* (2006.01)

(52) U.S. Cl. ........ 331/117 R; 331/15; 331/74; 331/109; 331/183; 326/27; 326/83; 327/108; 327/299

(58) Field of Classification Search ............ 331/15, 331/74, 109, 117 FE, 117 R, 182, 183; 326/26, 326/27, 80–83, 88; 327/108–112, 178, 299, 327/419, 427, 434, 436

See application file for complete search history.

(56) References Cited

U.S. PATENT DOCUMENTS

| | | | | |
|---|---|---|---|---|
| 5,493,232 A | * | 2/1996 | Kube | 326/27 |
| 5,625,325 A | | 4/1997 | Rotzoll et al. | |
| 5,859,573 A | | 1/1999 | Kukkonen | |
| 6,118,333 A | * | 9/2000 | Oda | 327/560 |
| 6,498,534 B1 | | 12/2002 | Kim et al. | |

(Continued)

FOREIGN PATENT DOCUMENTS

CN 101207364 A 6/2008

(Continued)

OTHER PUBLICATIONS

International Search Report and Written Opinion—PCT/US2010/040681, International Search Authority—European Patent Office—Oct. 11, 2010.

(Continued)

*Primary Examiner* — Levi Gannon
(74) *Attorney, Agent, or Firm* — William M. Hooks

(57) ABSTRACT

A circuit for a voltage controlled oscillator (VCO) buffer is described. The circuit includes a first capacitor connected to an input of the VCO buffer that is connected to a VCO core. The circuit also includes a second capacitor connected to the input of the VCO buffer and the gate of a p-type metal-oxide-semiconductor field effect (PMOS) transistor. The circuit further includes a first switch connected to the first capacitor and the gate of the PMOS transistor. The circuit also includes a third capacitor connected to the input of the VCO buffer. The circuit further includes a fourth capacitor connected to the input of the VCO buffer and the gate of an n-type metal-oxide-semiconductor field effect (NMOS) transistor. The circuit also includes a second switch connected to the third capacitor and the gate of the NMOS transistor.

38 Claims, 11 Drawing Sheets

U.S. PATENT DOCUMENTS

| | | | |
|---|---|---|---|
| 7,372,342 B2 * | 5/2008 | Berens | 331/116 R |
| 7,579,917 B2 * | 8/2009 | Sakai et al. | 331/74 |
| 7,719,374 B2 * | 5/2010 | Kuosmanen | 331/175 |
| 7,859,353 B2 * | 12/2010 | Liu et al. | 331/160 |
| 2005/0001691 A1 * | 1/2005 | Kim et al. | 331/117 R |
| 2006/0208808 A1 | 9/2006 | Bang et al. | |
| 2009/0237125 A1 * | 9/2009 | Zhao et al. | 327/108 |

FOREIGN PATENT DOCUMENTS

DE  19729157 A1  4/1998

OTHER PUBLICATIONS

Haiyong Wang, et al., "A novel CMOS low-phase-noise VCO with enlarged tuning range", ICMMT, 2008, vol. 2, pp. 570-573.

Moon H., et al., "1.3 V low close-in phase noise NMOS LC-VCO with parallel PMOS transistors", Electronics Letters, 2008, vol. 44 No. 11, pp. 676-678.

Roufoogaran R, et al., "A compact and power efficient local oscillator generation and distribution system for complex multi radio systems" Radio Frequency.

Integrated Circuits Symposium, 2008. RFIC 2008. IEEE, IEEE, Piscataway, NJ, USA, Jun. 17, 2008, pp. 277-280, XP031284334 ISBN: 978-1-42441808-4 *Section 111. Detailed Description*; pp. 277-279.

Ruey-Lue Wang, et al., "A Current-reused VCO with Degenerated RC Components", EDSSC, 2007, pp. 465-467.

* cited by examiner

ENHANCING DEVICE RELIABILITY FOR VOLTAGE CONTROLLED OSCILLATOR (VCO) BUFFERS UNDER HIGH VOLTAGE SWING CONDITIONS

RELATED APPLICATIONS

This application is related to and claims priority from U.S. Provisional Patent Application Ser. No. 61/222,064, filed Jun. 30, 2009, for "Methods And Apparatus For Enhancing Device Reliability for VCO Buffers Under High Voltage Swing Conditions," with inventors Chinmaya Mishra, Rajagopalan Rangarajan and Hongyan Yan.

TECHNICAL FIELD

The present disclosure relates generally to communication systems. More specifically, the present disclosure relates to systems and methods for enhancing device reliability for voltage controlled oscillator (VCO) buffers under high voltage swing conditions.

BACKGROUND

Wireless communication systems are widely deployed to provide various types of communication content such as voice, video, data, and so on. These systems may be multiple-access systems capable of supporting simultaneous communication of multiple wireless communication devices with one or more base stations.

For proper reception and transmission of wireless signals on a wireless communication network, a wireless communication device may use one or more voltage controlled oscillators (VCO) to generate a signal with a desired frequency. Wireless communication device and/or wireless communication system specifications may require that the amplitude of the signal generated meets certain requirements while the signal also maintains high levels of reliability. In addition, a wireless communication device may operate using batteries. Therefore, a voltage controlled oscillator using less current is advantageous. Benefits may be realized by providing improvements to voltage controlled oscillators (VCOs) and improvements relating to voltage controlled oscillators (VCOs).

SUMMARY

A circuit for a voltage controlled oscillator (VCO) buffer is disclosed. The circuit includes a first capacitor connected to an input of the VCO buffer. The input is connected to a VCO core. The circuit also includes a second capacitor connected to the input of the VCO buffer and the gate of a p-type metal-oxide-semiconductor field effect (PMOS) transistor. The circuit further includes a first switch connected to the first capacitor and the gate of the PMOS transistor. The circuit also includes a third capacitor connected to the input of the VCO buffer. The circuit further includes a fourth capacitor connected to the input of the VCO buffer and the gate of an n-type metal-oxide-semiconductor field effect (NMOS) transistor. The circuit also includes a second switch connected to the third capacitor and the gate of the NMOS transistor.

The first switch and the second switch may be in the closed position when the amplitude of the input is less than a threshold amplitude. The first switch and the second switch may be in the open position when the amplitude of the input is greater than a threshold amplitude. The source of the PMOS transistor may be connected to a rail voltage and the drain of the PMOS transistor may be connected to an output of the VCO buffer. The source of the NMOS transistor may be connected to ground and the drain of the NMOS transistor may be connected to an output of the VCO buffer.

When the first switch and the second switch are in the open position, an input voltage to the VCO buffer transistors may be decreased and an input voltage to the VCO buffer transistors may need to be decreased during the high VCO swing mode. The first switch and the second switch may be in the closed position during a low VCO swing mode; an input voltage to the VCO buffer transistors may not need to be decreased during the low VCO swing mode.

When the first switch is in the closed position, the first capacitor and the second capacitor may be connected in parallel, creating a larger capacitance value between the input of the VCO buffer and the gate of the PMOS transistor. A larger capacitance value between the input of the VCO buffer and the gate of the PMOS transistor may create a smaller voltage division resulting in a larger voltage swing at the gate of the PMOS transistor.

When the first switch is in the open position, only the second capacitor may be between the input of the VCO buffer and the gate of the PMOS transistor. A smaller capacitance value between the input of the VCO buffer and the gate of the PMOS transistor may create a larger voltage division resulting in a smaller voltage swing at the gate of the PMOS transistor.

When the second switch is in the closed position, the third capacitor and the fourth capacitor may be connected in parallel, creating a larger capacitance value between the input of the VCO buffer and the gate of the NMOS transistor. A larger capacitance value between the input of the VCO buffer and the gate of the NMOS transistor may create a smaller voltage division resulting in a larger voltage swing at the gate of the NMOS transistor.

When the second switch is in the open position, only the fourth capacitor may be between the input of the VCO buffer and the gate of the NMOS transistor. A smaller capacitance value between the input of the VCO buffer and the gate of the NMOS transistor may create a larger voltage division resulting in a smaller voltage swing at the gate of the NMOS transistor.

The first capacitor may be larger than the second capacitor and the third capacitor may be larger than the fourth capacitor. The circuit may also include a fifth capacitor connected to the gate of the PMOS transistor, a third switch connected to the fifth capacitor and ground, a sixth capacitor connected to the gate of the NMOS transistor and a fourth switch connected to the sixth capacitor and ground. When the third switch and the fourth switch are in the closed position, swing variation due to process variations in the first capacitor, the second capacitor, the third capacitor, the fourth capacitor, the NMOS transistor and the PMOS transistor may be reduced. The third switch and the fourth switch may be in the closed position when the amplitude of an oscillating voltage generated by the VCO core is greater than a threshold. The third switch and the fourth switch may be in the open position when the amplitude of an oscillating voltage generated by the VCO core is less than a threshold.

The first switch and the second switch may be controlled by a comparator that compares the amplitude of an oscillating voltage generated by the VCO core to a threshold to determine whether the first switch and the second switch are to be in the open or closed position. The third switch and the fourth switch may also be controlled by a comparator that compares the amplitude of an oscillating voltage generated by the VCO core to a threshold to determine whether the third switch and the fourth switch are to be in the open or closed position.

A method for automatic control of a voltage controlled oscillator (VCO) buffer is also described. An oscillating voltage is generated using a VCO core. An amplitude of the oscillating voltage is determined using an amplitude detector. The amplitude of the oscillating voltage is compared with a threshold amplitude using a comparator. A first switch and a second switch in the VCO buffer are closed when the amplitude of the oscillating voltage is less than the threshold amplitude. The first switch and the second switch in the VCO buffer are opened when the amplitude of the oscillating voltage is greater than the threshold amplitude. An output voltage is generated from the oscillating voltage using a VCO buffer.

A third switch and a fourth switch in the VCO buffer may be opened when the amplitude of the oscillating voltage is less than the threshold amplitude. The third switch and the fourth switch in the VCO buffer may be closed when the amplitude of the oscillating voltage is greater than the threshold amplitude. The voltage controlled oscillator (VCO) buffer may include a first capacitor connected to an input of the VCO buffer. The input may be connected to the VCO core. The VCO buffer may also include a second capacitor connected to the input of the VCO buffer and the gate of a p-type metal-oxide-semiconductor field effect (PMOS) transistor. The first switch may be connected to the first capacitor and the gate of the PMOS transistor. The VCO buffer may further include a third capacitor connected to the input of the VCO buffer. The VCO buffer may also include a fourth capacitor connected to the input of the VCO buffer and the gate of an n-type metal-oxide-semiconductor field effect (NMOS) transistor. The second switch may be connected to the third capacitor and the gate of the NMOS transistor.

The oscillating voltage may be applied to the VCO buffer transistors. When the first switch and the second switch are in the open position, the oscillating voltage applied to the VCO buffer transistors may be decreased. The first switch and the second switch may be in the open position during a high VCO swing mode. An input voltage to the VCO buffer transistors may need to be decreased during the high VCO swing mode.

The first switch and the second switch may be in the closed position during a low VCO swing mode. An input voltage to the VCO buffer transistors may not need to be decreased during the low VCO swing mode. When the first switch is in the closed position, the first capacitor and the second capacitor may be connected in parallel, creating a single larger capacitance value between the input of the VCO buffer and the gate of the PMOS transistor. A larger capacitance value between the input of the VCO buffer and the gate of the PMOS transistor may create a smaller voltage division resulting in a larger voltage swing at the gate of the PMOS transistor.

When the first switch is in the open position, only the second capacitor may be between the input of the VCO buffer and the gate of the PMOS transistor. A smaller capacitance value between the input of the VCO buffer and the gate of the PMOS transistor may create a larger voltage division resulting in a smaller voltage swing at the gate of the PMOS transistor. When the second switch is in the closed position, the third capacitor and the fourth capacitor may be connected in parallel, creating a larger capacitance value between the input of the VCO buffer and the gate of the NMOS transistor. A larger capacitance value between the input of the VCO buffer and the gate of the NMOS transistor may create a smaller voltage division resulting in a larger voltage swing at the gate of the NMOS transistor.

When the second switch is in the open position, only the fourth capacitor may be between the input of the VCO buffer and the gate of the NMOS transistor. A smaller capacitance value between the input of the VCO buffer and the gate of the NMOS transistor may create a larger voltage division resulting in a smaller voltage swing at the gate of the NMOS transistor. The first capacitor may be larger than the second capacitor and the third capacitor may be larger than the fourth capacitor. The VCO buffer may also include a fifth capacitor connected to the gate of the PMOS transistor, a third switch connected to the fifth capacitor and ground, a sixth capacitor connected to the gate of the NMOS transistor and a fourth switch connected to the sixth capacitor and ground.

When the third switch and the fourth switch are in the closed position, swing variation due to process variations in the first capacitor, the second capacitor, the third capacitor, the fourth capacitor, the NMOS transistor and the PMOS transistor may be reduced. The first switch and the second switch may be controlled by the comparator. The comparator may compare the amplitude of the oscillating voltage generated by the VCO core to the threshold to determine whether the first switch and the second switch are to be in the open or closed position. The third switch and the fourth switch may be controlled by the comparator. The comparator may compare the amplitude of the oscillating voltage generated by the VCO core to the threshold to determine whether the third switch and the fourth switch are to be in the open or closed position.

A wireless device having a voltage controlled oscillator buffer is described. The wireless device includes means for generating an oscillating voltage using a VCO core, means for determining an amplitude of the oscillating voltage using an amplitude detector, means for comparing the amplitude of the oscillating voltage with a threshold amplitude using a comparator, means for closing a first switch and a second switch in the VCO buffer when the amplitude of the oscillating voltage is less than the threshold amplitude, means for opening the first switch and the second switch in the VCO buffer when the amplitude of the oscillating voltage is greater than the threshold amplitude and means for generating an output voltage from the oscillating voltage using a VCO buffer.

A computer-program product for a voltage controlled oscillator buffer is also described. The computer-program product includes a computer-readable medium having instructions thereon. The instructions include code for generating an oscillating voltage using a VCO core, code for determining an amplitude of the oscillating voltage using an amplitude detector, code for comparing the amplitude of the oscillating voltage with a threshold amplitude using a comparator, code for closing a first switch and a second switch in the VCO buffer when the amplitude of the oscillating voltage is less than the threshold amplitude, code for opening the first switch and the second switch in the VCO buffer when the amplitude of the oscillating voltage is greater than the threshold amplitude and code for generating an output voltage from the oscillating voltage using a VCO buffer.

DETAILED DESCRIPTION

Figure 1:
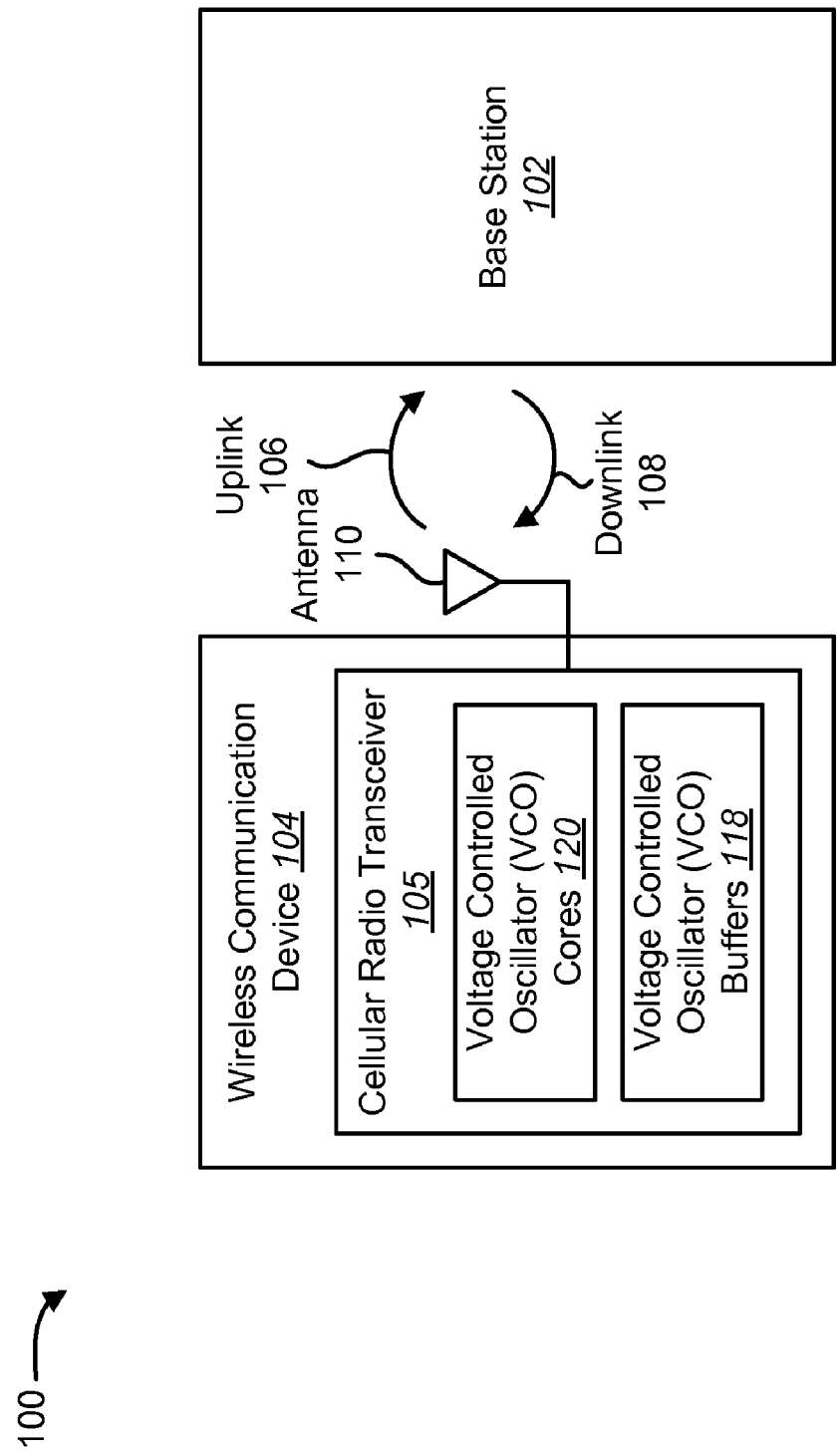
FIG. 1 shows a wireless communication system with multiple wireless devices.

FIG. 1 shows a wireless communication system 100 with multiple wireless devices. A wireless device may be a base station 102, a wireless communication device 104, or the like. A base station 102 is a station that communicates with one or more wireless communication devices 104. A base station 102 may also be referred to as, and may include some or all of the functionality of, an access point, a broadcast transmitter, a Node B, an evolved Node B, etc. Each base station 102 provides communication coverage for a particular geographic area. The term "cell" can refer to a base station 102 and/or its coverage area depending on the context in which the term is used.

A wireless communication device 104 may also be referred to as, and may include some or all of the functionality of, a terminal, an access terminal, a user equipment (UE), a mobile device, a subscriber unit, a station, etc. A wireless communication device 104 may be a cellular phone, a personal digital assistant (PDA), a wireless device, a wireless modem, a handheld device, a laptop computer, etc. A wireless communication device 104 may communicate with zero, one, or multiple base stations 102 on the downlink (DL) 108 and/or uplink (UL) 106 at any given moment using an antenna 110. The downlink 108 (or forward link) refers to the communication link from a base station 102 to the wireless communication device 104, and the uplink 106 (or reverse link) refers to the communication link from the wireless communication device 104 to the base station 102.

The wireless communication device may include a cellular radio transceiver 105. The cellular radio transceiver 105 may facilitate the sending and receiving of signals using the antenna 110. The cellular radio transceiver 105 is discussed in additional detail below in relation to FIG. 2. The cellular radio transceiver 105 may include one or more voltage controlled oscillator (VCO) cores 120. The cellular radio transceiver may also include one or more voltage controlled oscillator (VCO) buffers 118. Voltage controlled oscillator (VCO) cores 120 and voltage controlled oscillator (VCO) buffers 118 are discussed in additional detail below in relation to FIG. 3.

Wireless communication systems 100 may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, orthogonal frequency division multiple access (OFDMA) systems, and spatial division multiple access (SDMA) systems.

Figure 2:
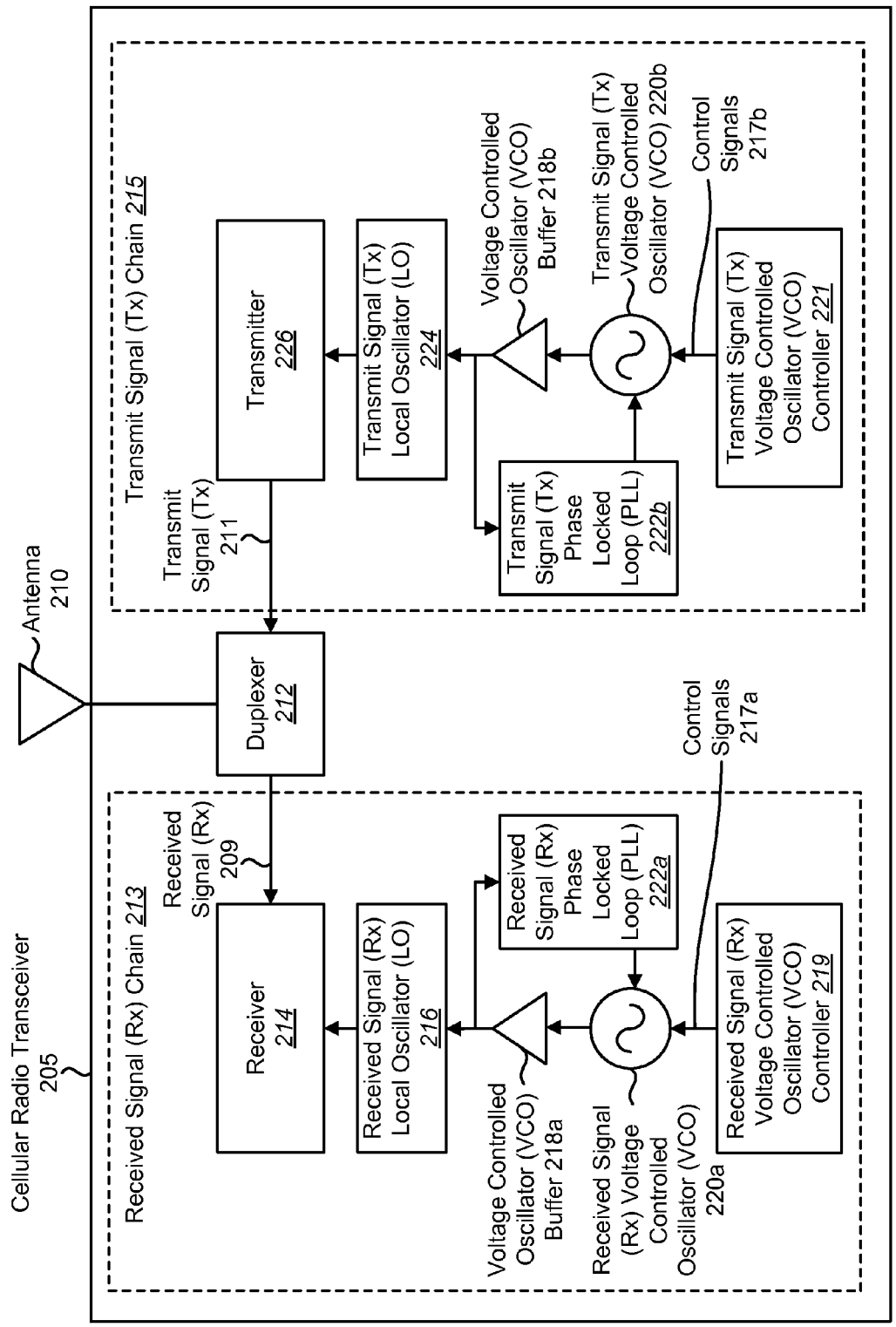
FIG. 2 is a block diagram illustrating a cellular radio transceiver.

FIG. 2 is a block diagram illustrating a cellular radio transceiver 205. The cellular radio transceiver 205 of FIG. 2 may be one configuration of the cellular radio transceiver 105 of FIG. 1. The cellular radio transceiver 205 may be included on a wireless communication device 104. The cellular radio transceiver 205 may be connected to an antenna 210. The antenna 210 may be used for sending and receiving wireless communications. The duplexer 212 may allow bi-directional communication over a single channel. In other words, the duplexer 212 may isolate the received signals (Rx) 209 from the transmit signals (Tx) 211.

Received signals (Rx) 209 may be sent through a duplexer 212 on the cellular radio transceiver 205 to a receive signal (Rx) chain 213. The received signal (Rx) chain 213 may include a receiver 214. To properly receive and decode received signals (RX) 209 by the receiver 214, the received signal (Rx) chain 213 may include a received signal (Rx) local oscillator (LO) 216. The received signal (Rx) local oscillator (LO) 216 may oscillate at the frequency of the received signal (Rx) 209. The frequency of the received signal (Rx) local oscillator (LO) 216 may be generated by a received signal (Rx) voltage controlled oscillator (VCO) 220a with a voltage controlled oscillator (VCO) buffer 218a and a received signal (Rx) phase locked loop (PLL) 222a. The received signal (Rx) phase locked loop (PLL) 222a may be a control system that generates a signal having a fixed relation to the phase of a reference signal. Voltage controlled oscillators (VCOs) 220 and voltage controlled oscillator (VCO) buffers 218 are discussed in further detail below in relation to FIGS. 3-8.

The received signal (Rx) chain 213 may include a received signal (Rx) voltage controlled oscillator (VCO) controller 219. The received signal (Rx) voltage controlled oscillator (VCO) controller 219 may be used to control the received signal (Rx) voltage controlled oscillator (VCO) 220a. For example, the received signal (Rx) voltage controlled oscillator (VCO) controller 219 may adjust the frequency generated by the received signal (Rx) voltage controlled oscillator (VCO) 220a as appropriate using control signals 217a. The received signal (Rx) voltage controlled oscillator (VCO) controller 219 may adjust the frequency generated by the received signal (Rx) voltage controlled oscillator (VCO) 220a to fine tune the received signal (Rx) voltage controlled oscillator (VCO) 220a or to move to a new frequency for a new wireless communication system 100.

The cellular radio transceiver 205 may prepare transmit signals (Tx) 211 for transmission using a transmit signal (Tx) chain 215. The transmit signal (Tx) chain 215 may include a transmitter 226. Transmit signals (Tx) 211 may be output by the transmitter 226 to the duplexer 212. To properly encode and transmit the transmit signals (Tx) 211, the transmit signal (Tx) chain 215 may include a transmit signal (Tx) local oscillator (LO) 224. The transmit signal (Tx) local oscillator (LO) 224 may oscillate at the frequency of transmission. In one configuration, the transmit signal (Tx) local oscillator (LO) 224 may oscillate at the frequency generated by a transmit signal (Tx) voltage controlled oscillator (VCO) 220b with a voltage controlled oscillator (VCO) buffer 218b and a transmit signal (Tx) phase locked loop (PLL) 222b. The transmit signal (Tx) phase locked loop (PLL) 222b may be a control system that generates a signal having a fixed relation to the phase of a reference signal.

The transmit signal (Tx) chain 215 may include a transmit signal (Tx) voltage controlled oscillator (VCO) controller 221. The transmit signal (Tx) voltage controlled oscillator (VCO) controller 221 may be used to control the transmit signal (Tx) voltage controlled oscillator (VCO) 220b. For example, the transmit signal (Tx) voltage controlled oscillator (VCO) controller 221 may adjust the frequency generated by the transmit signal (Tx) voltage controlled oscillator (VCO) 220b as appropriate using control signals 217b. The transmit signal (Tx) voltage controlled oscillator (VCO) controller 221 may adjust the frequency generated by the transmit signal (Tx) voltage controlled oscillator (VCO) 220b to fine tune the transmit signal (Tx) voltage controlled oscillator (VCO) 220b or to move to a new frequency for a new wireless communication system 100.

Figure 3:
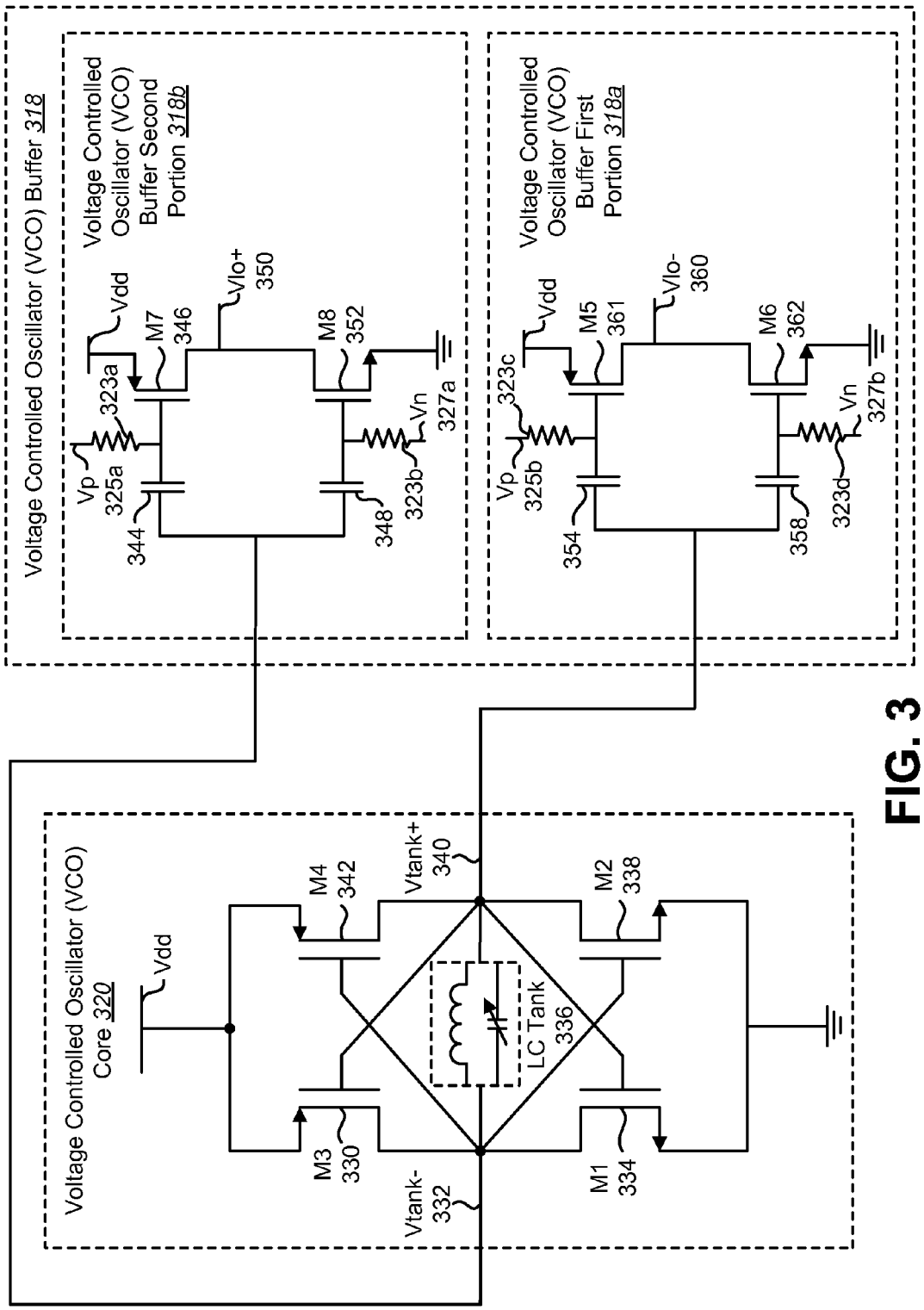
FIG. 3 is a circuit diagram illustrating a voltage controlled oscillator (VCO) core and a voltage controlled oscillator (VCO) buffer.

FIG. 3 is a circuit diagram illustrating a voltage controlled oscillator (VCO) core 320 and a voltage controlled oscillator (VCO) buffer 318. The voltage controlled oscillator (VCO) core 320 of FIG. 3 may be one configuration of the received signal (Rx) voltage controlled oscillator (VCO) 220a and/or the transmit signal (Tx) voltage controlled oscillator (VCO) 220b of FIG. 2. The voltage controlled oscillator (VCO) core 320 may include a first n-type metal-oxide-semiconductor (NMOS) field effect transistor M1 334 with the source of M1 334 connected to ground and the drain of M1 334 connected to an output Vtank− 332 of the voltage controlled oscillator (VCO) core 320. The gate of M1 334 may be connected to an output Vtank+ 340 of the voltage controlled oscillator (VCO) core 320. The voltage controlled oscillator (VCO) core 320 may include a second NMOS transistor M2 338 with the source of M2 338 connected to ground and the drain of M2 338 connected to the output Vtank+ 340. The gate of M2 338 may be connected to the output Vtank− 332.

The voltage controlled oscillator (VCO) core 320 may also include a first p-type metal-oxide-semiconductor (PMOS) field effect transistor M3 330 with the source of M3 330 connected to the positive rail Vdd and the drain of M3 330 connected to the output Vtank− 332 of the voltage controlled oscillator (VCO) core 320. The gate of M3 330 may be connected to the output Vtank+ 340. The voltage controlled oscillator (VCO) core 320 may further include a second PMOS transistor M4 342 with the source of M4 342 connected to Vdd, the drain of M4 342 connected to the output Vtank+ 340, and the gate of M4 342 connected to the output Vtank− 332. An inductor/capacitor (LC) tank 336 may connect Vtank+ 340 and Vtank− 332. The inductor/capacitor (LC) tank 336 may be an inductor and a capacitor coupled in a resonant circuit designed to generate an oscillating signal.

The outputs of the voltage controlled oscillator (VCO) core 320 may be input into a voltage controlled oscillator (VCO) buffer 318. The voltage controlled oscillator (VCO) buffer 318 of FIG. 3 may be one configuration of the received signal (Rx) voltage controlled oscillator (VCO) buffer 218a and/or the transmit signal (Tx) voltage controlled oscillator (VCO) buffer 218b of FIG. 2. The voltage controlled oscillator (VCO) buffer 318 may include a voltage controlled oscillator (VCO) buffer first portion 318a that receives Vtank+ 340 from the voltage controlled oscillator (VCO) core 320 and a voltage controlled oscillator (VCO) buffer second portion 318b that receives Vtank− 332 from the voltage controlled oscillator (VCO) core 320.

The voltage controlled oscillator (VCO) buffer first portion 318a receiving Vtank+ 340 may include a first capacitor 354 and a second capacitor 358; each capacitor is connected to Vtank+ 340. The node on the other side of the first capacitor 354 may include a resistor 323c connecting the node to the direct current (DC) bias voltage Vp 325b of a PMOS transistor M5 361. The node may also be connected to the gate of the PMOS transistor M5 361. Similarly, the node on the other side of the second capacitor 358 may include a resistor 323d connecting the node to the DC bias voltage Vn 327b of an NMOS transistor M6 362. The node may also be connected to the gate of the NMOS transistor M6 362. The source of M6 362 may be connected to ground and the drain of M6 362 may be connected to an output Vlo− 360 of the voltage controlled oscillator (VCO) buffer 318. The source of M5 361 may be connected to Vdd and the drain of M5 361 may be connected to the output Vlo− 360.

The voltage controlled oscillator (VCO) buffer second portion 318b receiving Vtank− 332 may include a third capacitor 344 and a fourth capacitor 348, where each capacitor connected to Vtank− 332. The node on the other side of the third capacitor 344 may include a resistor 323a connecting the node to Vp 325a. The node may connect the third capacitor 344 to the gate of a PMOS transistor M7 346. Similarly, the node on the other side of the fourth capacitor 348 may include a resistor 323b connecting the node to Vn 327a. The node may also connect the fourth capacitor 348 to the gate of an NMOS transistor M8 352. The source of M8 352 may be connected to ground and the drain of M8 352 may be connected to an output Vlo+ 350 of the voltage controlled oscillator (VCO) buffer 318. The source of M7 346 may be connected to Vdd and the drain of M7 346 may be connected to the output Vlo+ 350. Vtank+ 340 and Vtank− 332 may have a 3 volt (V) differential peak waveform for meeting stringent phase noise specifications, e.g. the CDMA Personal Communications Service (PCS) 1X band and the Advanced Wireless Services (AWS) band.

Figure 4:
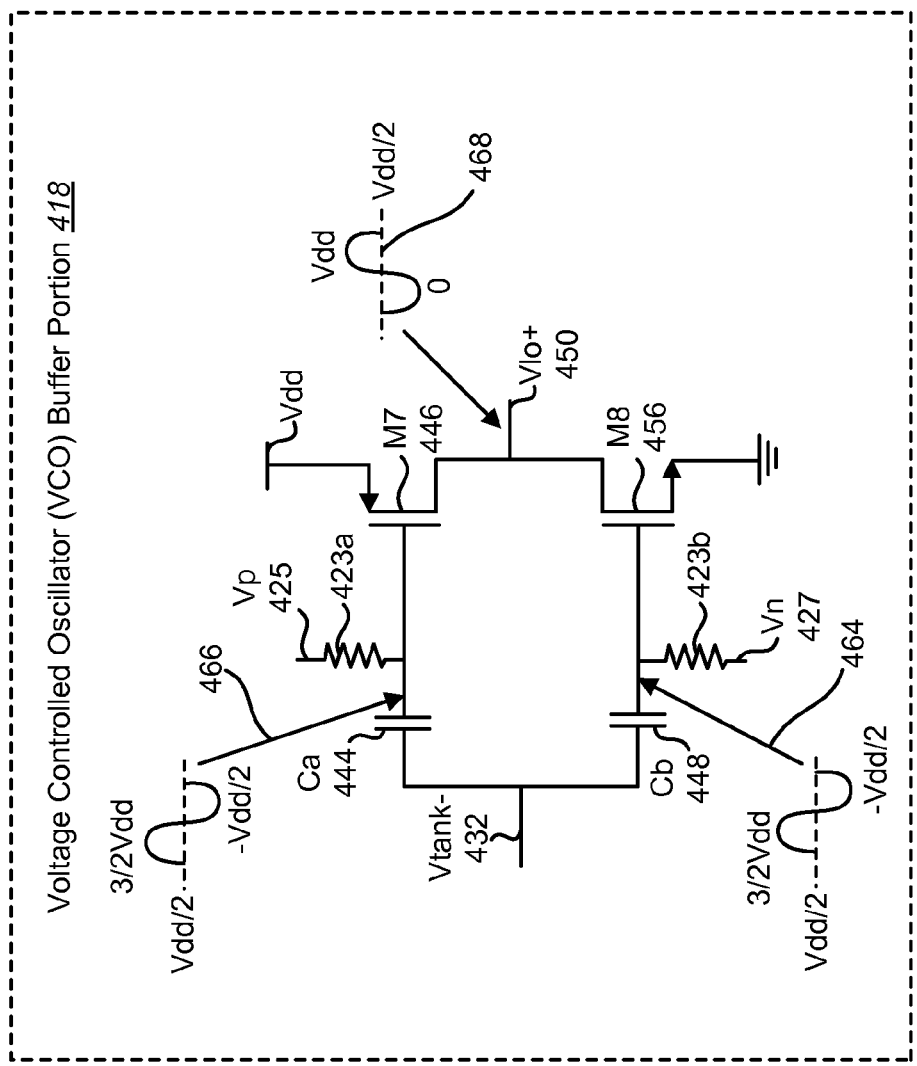
FIG. 4 is a circuit diagram illustrating the voltage swing of one voltage controlled oscillator (VCO) buffer portion.

FIG. 4 is a circuit diagram illustrating the voltage swing of one voltage controlled oscillator (VCO) buffer portion 418. The voltage controlled oscillator (VCO) buffer portion 418 of FIG. 4 may be one configuration of the voltage controlled oscillator (VCO) buffer second portion 318b of FIG. 3. Similar voltage swings may apply to the voltage controlled oscillator (VCO) buffer first portion 318a of FIG. 3. The voltage controlled oscillator (VCO) buffer portion 418 may receive Vtank− 432 from a voltage controlled oscillator (VCO) core 320. Vtank− 432 may be connected to a first capacitor Ca 444 and a second capacitor Cb 448. The first capacitor Ca 444 may be connected to the gate of M7 446. The first capacitor Ca 444 may also be connected to Vp 425 through a resistor 423a. The second capacitor Cb 448 may be connected to the gate of M8 456. The second capacitor Cb 448 may be connected to Vn 427 through a resistor 423b.

The source of M7 446 may be connected to Vdd. As waveform 466 illustrates, the voltage swing at the gate of M7 446 may be as high as 3/2 Vdd and as low as −½ Vdd. As waveform 468 illustrates, the drain of M7 446, which is connected to an output Vlo+ 450 of the voltage controlled oscillator (VCO) buffer 418, may be as high as Vdd and as low as 0 V. Thus, the voltage from gate to drain (VGD) of M7 446 may be as high as ½ Vdd and as low as −3/2 Vdd.

The source of M8 456 may be connected to ground and the drain of M8 456 may be connected to Vlo+ 450. As waveform 464 illustrates, the voltage swing at the gate of M8 456 may be as high as 3/2 Vdd and as low as −½ Vdd. Thus, the voltage from gate to drain (VGD) of M8 456 may be as high as 3/2 Vdd and as low as −3/2 Vdd. Voltages from gate to source (VGS) or VGD for a transistor as high as 3/2 Vdd may cause reliability issues due to both hot carrier injection (HCI) and gate oxide breakdown.

In modern wireless communication systems 100, current consumption may be important in order to prolong battery life. Reliable operation may also be important. Reliable operation may become more challenging as more deep submicron processes are used. This is required because voltage swings do not scale with process whereas gate oxide breakdown voltages do.

To solve this problem, one solution is to use thick oxide devices for M7 446 and M8 456. However, thick oxide devices may add extra parasitics to the oscillating node, thereby reducing the tuning range of the oscillator. Extra parasitics may also impact the drive strength of the voltage controlled oscillator (VCO) buffer 318 due to the larger self-capacitance. Thus, the use of extra parasitics impacts current consumption. Other solutions use fixed resistive or capacitive dividers to reduce the swing at the input of the voltage controlled oscillator (VCO) buffer 318. The use of fixed resistive or capacitive dividers may impact phase noise (PN). Furthermore, fixed resistive or capacitive dividers lack mode dependent operability. Thus, an alternative design for a voltage controlled oscillator (VCO) buffer 318 may be desirable.

Figure 5:
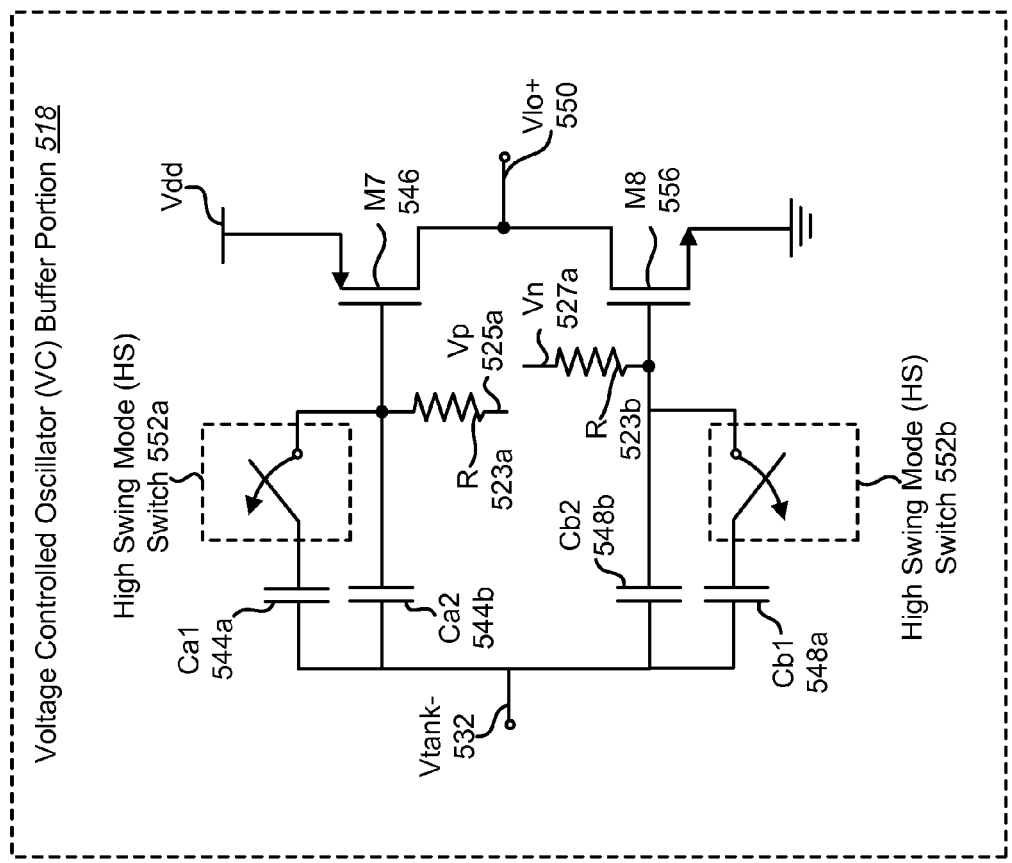
FIG. 5 is another circuit diagram illustrating a voltage controlled oscillator (VCO) buffer portion for use in the present systems and methods.

FIG. 5 is another circuit diagram illustrating a voltage controlled oscillator (VCO) buffer portion 518 for use in the present systems and methods. The voltage controlled oscillator (VCO) buffer portion 518 of FIG. 5 may be one configuration of the voltage controlled oscillator (VCO) buffer second portion 318b of FIG. 3. A similar circuit diagram as that used in FIG. 5 may be used as one configuration of the voltage controlled oscillator (VCO) buffer first portion 318a of FIG. 3.

The voltage controlled oscillator (VCO) buffer portion 518 may receive Vtank− 532 from a voltage controlled oscillator (VCO) core 320. Vtank− 532 may be connected to a first capacitor Ca1 544a, a second capacitor Ca2 544b, a third capacitor Cb1 548a, and a fourth capacitor Cb2 548b. Ca1+Ca2 may be equal or approximately equal to the first capacitor Ca 444 from FIG. 4. Likewise, Cb1+Cb2 may be equal or approximately equal to the second capacitor Cb 448 from FIG. 4. In one configuration, Ca1>Ca2 and Cb1>Cb2. The first capacitor Ca 444 from FIG. 4 may be split to form Ca1 544a and Ca2 544b in such a way that the voltage swings at the gates of transistors M7 546 and M8 556 are brought down to levels that are reliable. Likewise, the second capacitor Cb 448 from FIG. 4 may be split to form Cb1 548a and Cb2 548b in such a way that the voltage swings at the gates of transistors M7 546 and M8 556 are brought down to levels that are reliable. The first capacitor Ca 444 and the second capacitor Cb 448 from FIG. 4 may also be split according to the size of the PMOS (M7) 546 and NMOS (M8) 556 devices.

As in FIG. 4, the source of M7 546 may be connected to Vdd, the drain of M7 546 may be connected to Vlo+ 550, the drain of M8 556 may be connected to Vlo+ 550, and the source of M8 556 may be connected to ground. The second capacitor Ca2 544b may be connected to the gate of M7 546. The gate of M7 546 may also be connected to Vp 525a through a resistor R 523a. The first capacitor Ca1 544a may be separated from the gate of M7 546 by a first high swing mode (HS) switch 552a. The fourth capacitor Cb2 548a may be connected to the gate of M8 556. The gate of M8 556 may be also be connected to Vn 527a through a resistor R 523b. The third capacitor Cb1 548b may be separated from the gate of M8 556 by a second high swing mode (HS) switch 552b. High swing mode (HS) switches 552 are discussed in further detail below in relation to FIG. 6.

The high swing mode (HS) switches 552 may be turned ON (or closed) under low voltage controlled oscillator (VCO) swing mode. When the high swing mode (HS) switches 552 are turned ON, the first capacitor Ca1 544a is in parallel with the second capacitor Ca2 544b. When the high swing mode (HS) switches 552 are turned ON, the third capacitor Cb1 548a is in parallel with the fourth capacitor Cb2 548b. Thus, when the high mode swing (HS) switches 552 are turned ON, the total capacitance between Vtank− 532 and the gate of M7 546 is Ca1+Ca2 and the total capacitance between Vtank− 532 and the gate of M8 556 is Cb1+Cb2. A larger capacitance value will have a smaller voltage division. Thus, the voltage swing of Vtank− 532 at the gates of M7 546 and M8 556 respectively may not be severely impacted when the high swing mode (HS) switches 552 are turned ON.

The high swing mode (HS) switches 552 may be turned OFF under high voltage controlled oscillator (VCO) swing mode. When the high swing mode (HS) switches 552 are turned OFF, Ca1 544a and Cb1 548a are effectively removed from the voltage controlled oscillator (VCO) buffer portion 518 of FIG. 5. The voltage swing of Vtank− 532 at the gates of M7 546 and M8 556 is affected only by the capacitance of Ca2 544b and Cb2 548b. Thus, the voltage swing of Vtank− 532 at the gates of M7 546 and M8 556 is affected by a smaller capacitance when the high swing mode (HS) switches 552 are turned OFF than when the high swing mode (HS) switches 552 are turned ON. A smaller capacitance creates a larger voltage division. Thus, when the high swing mode (HS) switches 552 are turned OFF, the voltage swing of Vtank− 532 at the gates of M7 546 and M8 556 may be decreased considerably more than when the high swing mode (HS) switches 552 are turned ON. In other words, under high voltage controlled oscillator (VCO) swing mode, the voltage swing of Vtank− 532 at the gates of M7 546 and M8 556 may be decreased by a significant factor. Under low voltage controlled oscillator (VCO) swing mode, the voltage swing of Vtank− 532 at the gates of M7 546 and M8 556 is not decreased by a significant factor. When the high swing mode (HS) switches 552 are turned OFF, degradation of phase noise (PN) of the voltage controlled oscillator (VCO) may be prevented which may have an indirect impact on current consumption.

Although the high swing mode (HS) switches 552 of FIG. 5 are shown between the output of a voltage controlled oscillator (VCO) core 320 and the input of a voltage controlled oscillator (VCO) buffer 318, the high swing mode (HS) switches 552 may be similarly used for amplitude control in circuits other than voltage controlled oscillator (VCO) buffers 318.

Figure 6:
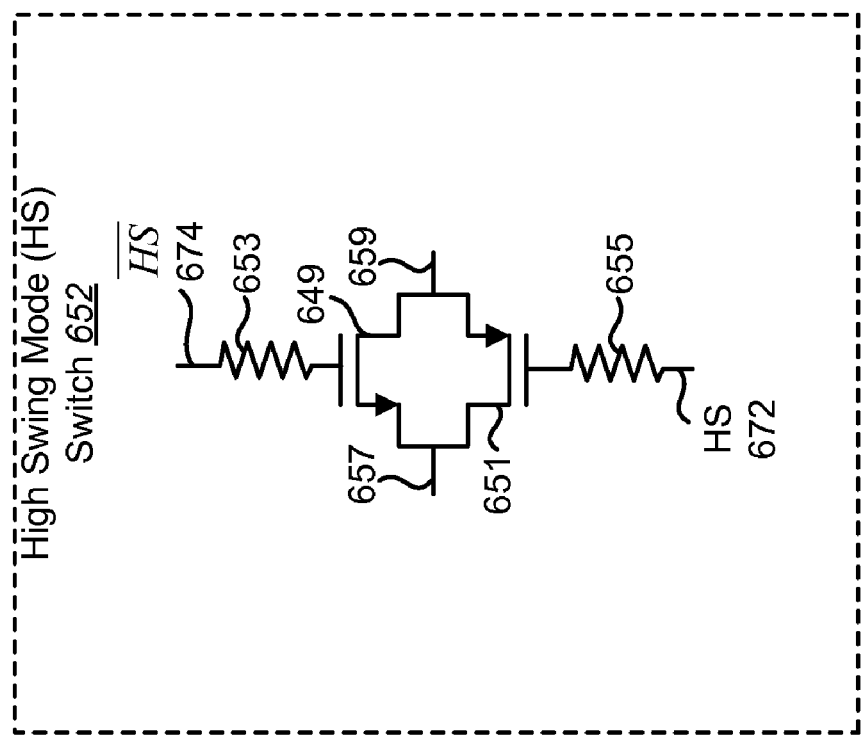
FIG. 6 is a circuit diagram illustrating a high swing mode (HS) switch for use in the present systems and methods.

FIG. 6 is a circuit diagram illustrating a high swing mode (HS) switch 652 for use in the present systems and methods. The high swing mode (HS) switch 652 of FIG. 6 may be one configuration of the high swing mode (HS) switches 552 of FIG. 5. A high swing mode (HS) switch 552 may be realized using a transmission gate structure to reduce finite resistance when the high swing mode (HS) switch 652 is in the ON (or closed) position so as to not degrade the quality factor (Q) of the alternating current (AC) coupling capacitance.

As shown in FIG. 6, a high swing mode (HS) switch 652 may be implemented using a PMOS transistor 651 with the gate of the PMOS transistor 651 connected to a resistor 655 that is also connected to a high swing mode switching control HS 672, the drain of the PMOS transistor 651 connected to an input 657 of the high swing mode (HS) switch 652, and the source of the PMOS transistor 651 connected to an output 659 of the high swing mode (HS) switch 652. The high swing mode (HS) switch 652 may further include an NMOS transistor 649 with the gate of the NMOS transistor 649 connected to a resistor 653 that is also connected to a complementary high swing mode switching control $\overline{HS}$ 674. The drain of the NMOS transistor 649 may be connected to the output 659 of the high swing mode (HS) switch 652 and the source of the NMOS transistor 649 may be connected to the input 657 of the high swing mode (HS) switch 652.

Figure 7:
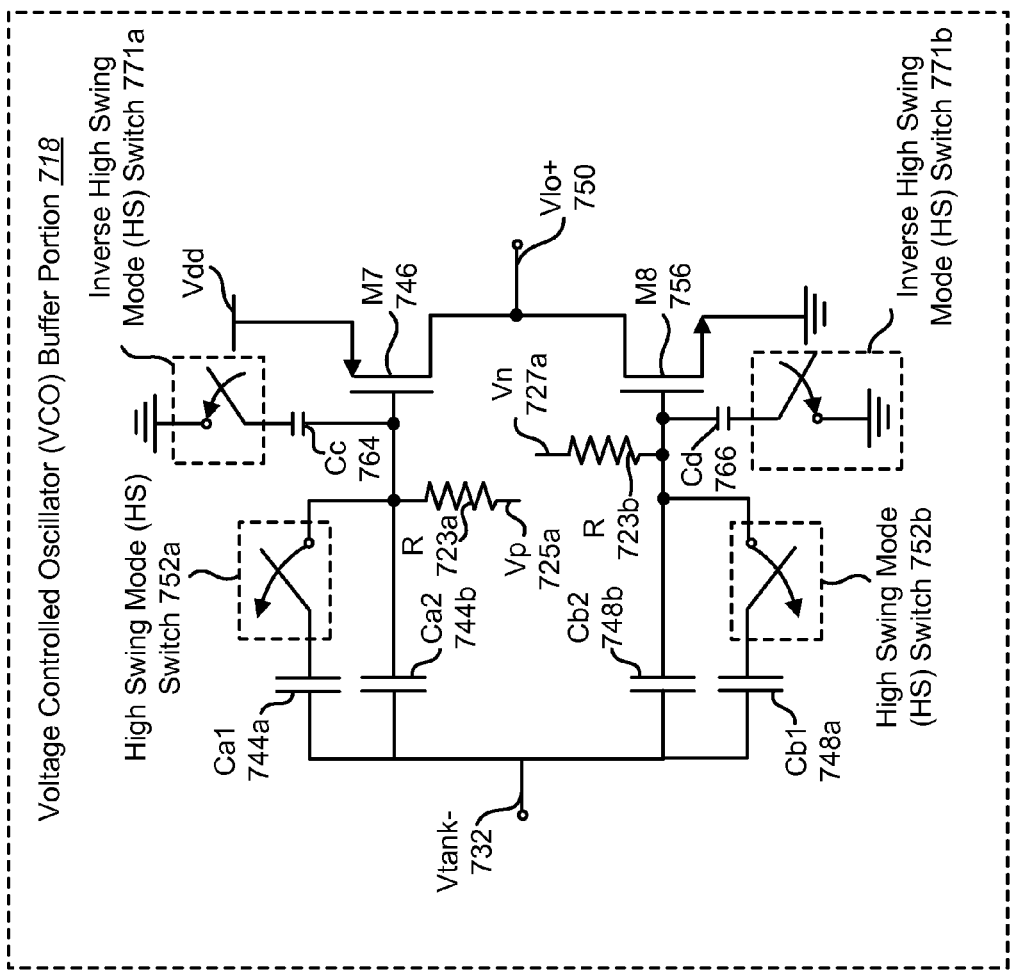
FIG. 7 is a circuit diagram illustrating another configuration of a voltage controlled oscillator (VCO) buffer portion for use in the present systems and methods.

FIG. 7 is a circuit diagram illustrating another configuration of a voltage controlled oscillator (VCO) buffer portion 718 for use in the present systems and methods. The voltage controlled oscillator (VCO) buffer portion 718 of FIG. 7 may be one configuration of the voltage controlled oscillator (VCO) buffer second portion 318b of FIG. 3. A similar circuit diagram as that used in FIG. 7 may be used as one configuration of the voltage controlled oscillator (VCO) buffer first portion 318a of FIG. 3.

The voltage controlled oscillator (VCO) buffer portion 718 may receive Vtank− 732 from a voltage controlled oscillator (VCO) core 320. Vtank− 732 may be connected to a first capacitor Ca1 744a, a second capacitor Ca2 744b, a third capacitor Cb1 748a, and a fourth capacitor Cb2 748b. The second capacitor Ca2 744b may be connected to the gate of M7 746 and the fourth capacitor Cb2 748b may be connected to the gate of M8 756. The gate of M7 746 may also be connected to Vp 725a through a resistor R 723a. The gate of M8 756 may also be connected to Vn 727a through a resistor R 723b.

The source of M7 746 may be connected to Vdd and the drain of M7 746 may be connected to an output of the voltage controlled oscillator (VCO) buffer portion 718 Vlo+ 750. The source of M8 756 may be connected to ground and the drain of M8 756 may be connected to Vlo+ 750. The first capacitor Ca1 744a may be connected to a first high swing mode (HS) switch 752a. The first high swing mode (HS) switch 752a may also be connected to the gate of M7 746. The fourth capacitor Cb2 748b may be connected to a second high swing mode (HS) switch 752b. The second high swing mode (HS) switch 752b may also be connected to the gate of M8 756. High swing mode (HS) switches 752 were discussed above in relation to FIG. 6.

A fifth capacitor Cc 764 may be connected to the gate of M7 746 and to a first inverse high swing mode (HS) switch 771a. The first inverse high swing mode (HS) switch 771a may also be connected to ground. A sixth capacitor Cd 766 may be connected to the gate of M8 756 and to a second inverse high swing mode (HS) switch 771b. The second inverse high swing mode (HS) switch 771b may also be connected to ground. Inverse high swing mode (HS) switches 771 are discussed in further detail below in relation to FIG. 8.

The high swing mode (HS) switches 752 may be turned OFF (or opened) under high voltage controlled oscillator (VCO) swing mode. The inverse high swing mode (HS) switches 771 may thus be turned ON (or closed) under high voltage controlled oscillator (VCO) swing mode. During a high voltage controlled oscillator (VCO) swing mode when the inverse high swing mode (HS) switches 771 are ON, the fifth capacitor Cc 764 and the sixth capacitor Cd 766 are each connected to ground. The fifth capacitor Cc 764 and the sixth capacitor Cd 766 may then reduce the swing variation due to process variations in the transistor devices, since the voltage division would now be only dependent on the ratio of capacitances. The use of the fifth capacitor Cc 764 and the sixth capacitor Cd 766 adds extra capacitance to the voltage controlled oscillator (VCO) core 220 and hence needs to be carefully considered. During low voltage controlled oscillator (VCO) swing mode, the high swing mode (HS) switches 752 may be turned ON and the inverse high swing mode (HS) switches 771 may be turned OFF. Thus, during low voltage controlled oscillator (VCO) swing mode, the fifth capacitor Cc 764 and the sixth capacitor Cd 766 do not significantly affect the voltage swing.

Figure 8:
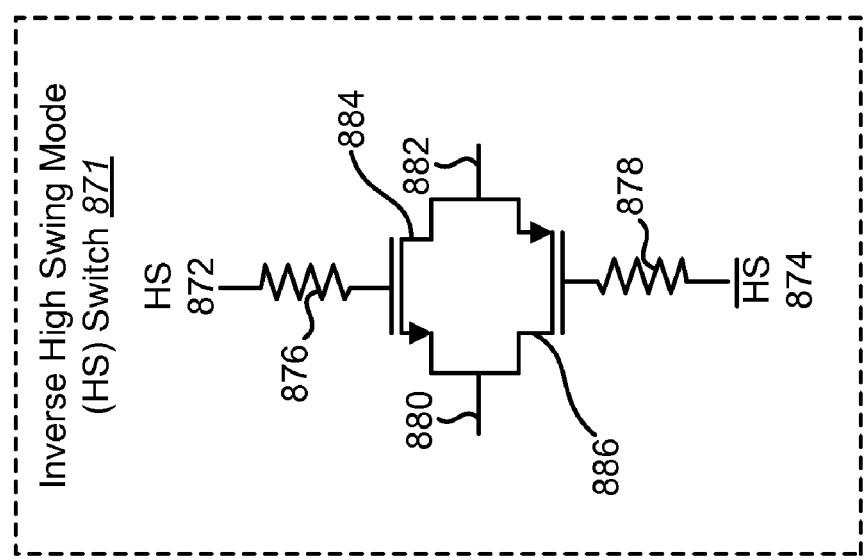
FIG. 8 is a circuit diagram illustrating an inverse high swing mode (HS) switch for use in the present systems and methods.

FIG. 8 is a circuit diagram illustrating an inverse high swing mode (HS) switch 871 for use in the present systems and methods. The inverse high swing mode (HS) switch 871 of FIG. 8 may be one configuration of the inverse high swing mode (HS) switches 771 of FIG. 7. An inverse high swing mode (HS) switch 871 may be realized using a transmission gate structure to reduce finite resistance when the inverse high swing mode (HS) switch 871 is in the ON (or closed) position so as to not degrade the quality factor (Q) of the alternating current (AC) coupling capacitance.

As shown in FIG. 8, an inverse high swing mode (HS) switch 871 may be implemented using a PMOS transistor 886 with the gate of the PMOS transistor 886 connected to a resistor 878 that is also connected to a complementary high swing mode switching control $\overline{HS}$ 874, the drain of the PMOS transistor 886 connected to an input 880 of the inverse high swing mode (HS) switch 871, and the source of the PMOS transistor 886 connected to an output 882 of the inverse high swing mode (HS) switch 871. The inverse high swing mode (HS) switch 871 may further include an NMOS transistor 884 with the gate of the NMOS transistor 884 connected to a resistor 876 that is also connected to a high swing mode switching control HS 872, the drain of the NMOS transistor 884 connected to the output 882 of the inverse high swing mode (HS) switch 871, and the source of the NMOS transistor 884 connected to the input 880 of the inverse high swing mode (HS) switch 871.

Figure 9:
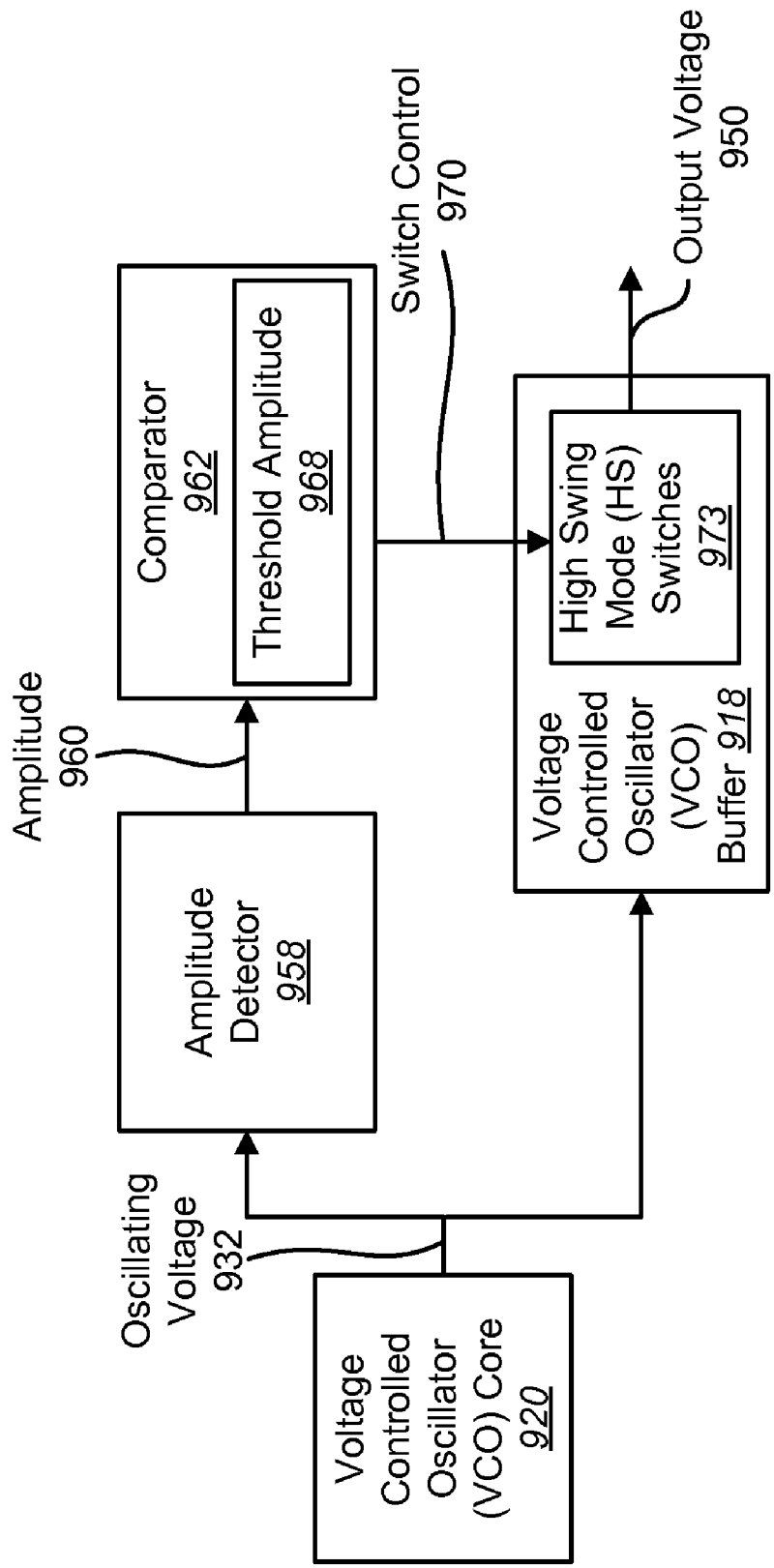
FIG. 9 is a block diagram illustrating automatic control of high swing mode (HS) switches in a voltage controlled oscillator (VCO) buffer.

FIG. 9 is a block diagram illustrating automatic control of high swing mode (HS) switches 973 in a voltage controlled oscillator (VCO) buffer 918. A voltage controlled oscillator (VCO) core 920 may generate an oscillating voltage 932. The voltage controlled oscillator (VCO) core 920 in FIG. 9 may be one configuration of the voltage controlled oscillator (VCO) core 320 in FIG. 3. An amplitude detector 958 may detect the amplitude 960 of the oscillating voltage 932. A comparator 962 may then compare the amplitude 960 of the oscillating voltage 932 with a threshold amplitude 968. Based on the comparison between the amplitude 960 and the threshold amplitude 968, the comparator 962 may then automatically control high swing mode (HS) switches 973 as part of a voltage controlled oscillator (VCO) buffer 918 via a switch control 970.

The high swing mode (HS) switches 973 of FIG. 9 may include both high swing mode (HS) switches 652 and inverse high swing mode (HS) switches 871. When the voltage controlled oscillator (VCO) swing of the oscillating voltage 932 is high to meet stringent PN specifications, switching the high swing mode (HS) switches 973 (i.e. turning the high swing mode (HS) switches 652 OFF and the inverse high swing mode (HS) switches 871 ON) may improve device reliability. Furthermore, switching the high swing mode (HS) switches 973 may improve PN performance and hence has an indirect impact on current consumption.

The voltage controlled oscillator (VCO) buffer 918 may receive the oscillating voltage 932 from the voltage controlled oscillator (VCO) core 920. The voltage controlled oscillator (VCO) buffer 918 may then output an output voltage 950. The use of high swing mode (HS) switches 973 in the voltage controlled oscillator (VCO) buffer 918 may provide the advantage of meeting reliability requirements while offering superior phase noise performance under high voltage swings. Furthermore, the use of high swing mode (HS) switches 973 may reduce the current required. The structure of the high swing mode (HS) switches 973 in the voltage controlled oscillator (VCO) buffer 918 can be ported to smaller feature size technologies where the reliability issue is more relevant. By using high swing mode (HS) switches 973, programmability in voltage swing to the device based on mode of operation and performance requirements may be achieved.

Using high swing mode (HS) switches 973 may also allow gain programmability between the voltage controlled oscillator (VCO) core 920 output and the voltage controlled oscillator (VCO) buffer 918 input as a function of the detected voltage controlled oscillator (VCO) amplitude 960. The use of high swing mode (HS) switches 973 is not restricted to CDMA 1x mode; high swing mode (HS) switches 973 may be used in the design of radios in smaller feature size technologies supporting advanced modulation schemes for high data rate standards (e.g. Long Term Evolution (LTE)) which would continue to demand superior phase noise performances. The increased reliability of wireless communication devices 104 using high swing mode (HS) switches 973 may also become more prominent as technology moves into nanometer scale processes such as 45 nanometers (nm), 32 nm, and so on.

Figure 10:
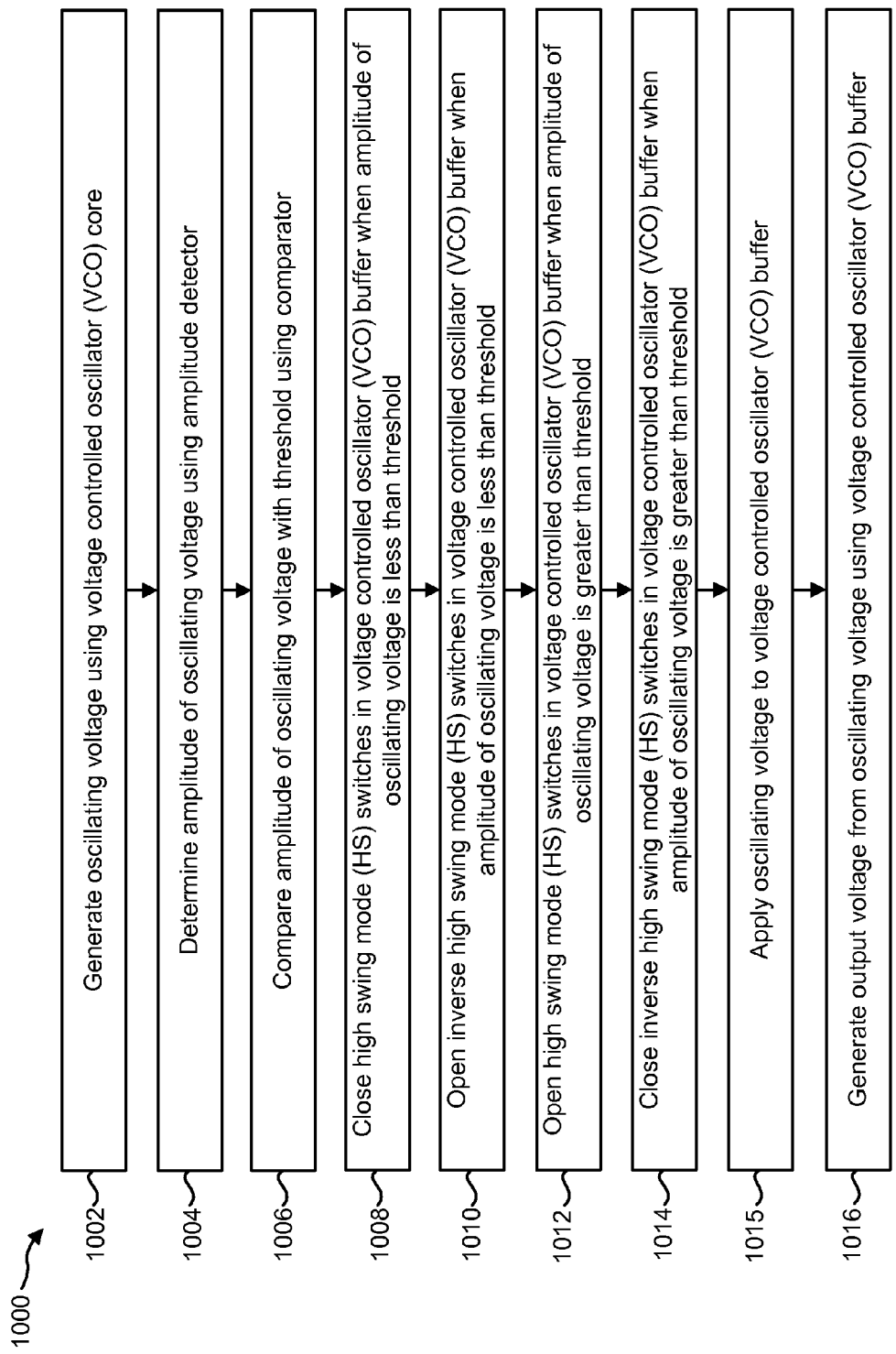
FIG. 10 is a flow diagram illustrating a method 1000 for enhancing device reliability for voltage controlled oscillator (VCO) buffers.

FIG. 10 is a flow diagram illustrating a method 1000 for enhancing device reliability for voltage controlled oscillator (VCO) buffers 318. The method 1000 may be performed by a wireless communication device 104. An oscillating voltage 932 may be generated 1002 using a voltage controlled oscillator (VCO) core 320. The amplitude 960 of the oscillating voltage 932 may be determined 1004 using an amplitude detector 958. The amplitude 960 of the oscillating voltage 932 may then be compared 1006 with a threshold amplitude 968 using a comparator 962.

High swing mode (HS) switches 752 in a voltage controlled oscillator (VCO) buffer 718 may be closed 1008 or switched ON when the amplitude 960 of the oscillating voltage 932 is less than the threshold amplitude 968. Inverse high swing mode (HS) switches 771 in the voltage controlled oscillator (VCO) buffer 718 may be opened 1010 or switched OFF when the amplitude 960 of the oscillating voltage 932 is less than the threshold amplitude 968. High swing mode (HS) switches 752 in the voltage controlled oscillator (VCO) buffer 718 may be opened 1012 or switched OFF when the amplitude 960 of the oscillating voltage 932 is greater than the threshold amplitude 968. Inverse high swing mode (HS) switches 771 in the voltage controlled oscillator (VCO) buffer 718 may be closed 1014 or switched ON when the amplitude 960 of the oscillating voltage 932 is greater than the threshold amplitude 968. The oscillating voltage 932 may be applied 1015 to the voltage controlled oscillator (VCO) buffer 718. An output voltage 950 may then be generated 1016 from the oscillating voltage 932 using the voltage controlled oscillator (VCO) buffer 718. The output voltage 950 may oscillate at a desired frequency.

Figure 11:
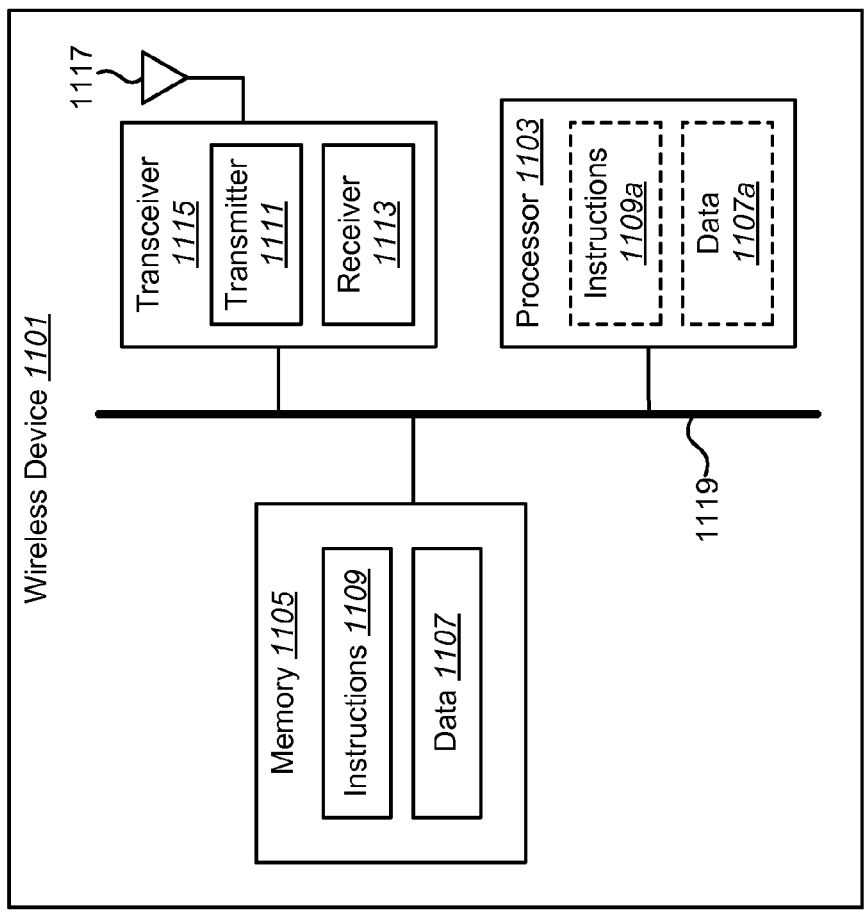
FIG. 11 illustrates certain components that may be included within a wireless device that is configured in accordance with the present disclosure.

FIG. 11 illustrates certain components that may be included within a wireless device 1101. The wireless device 1101 may be a wireless communication device 104 and may implement the present systems and methods as disclosed herein.

The wireless device 1101 includes a processor 1103. The processor 1103 may be a general purpose single- or multi-chip microprocessor (e.g., an ARM), a special purpose microprocessor (e.g., a digital signal processor (DSP)), a microcontroller, a programmable gate array, etc. The processor 1103 may be referred to as a central processing unit (CPU). Although just a single processor 1103 is shown in the wireless device 1101 of FIG. 11, in an alternative configuration, a combination of processors (e.g., an ARM and DSP) could be used.

The wireless device 1101 also includes memory 1105. The memory 1105 may be any electronic component capable of storing electronic information. The memory 1105 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1107 and instructions 1109 may be stored in the memory 1105. The instructions 1109 may be executable by the processor 1103 to implement the methods disclosed herein. Executing the instructions 1109 may involve the use of the data 1107 that is stored in the memory 1105. When the processor 1103 executes the instructions 1109, various portions of the instructions 1109a may be loaded onto the processor 1103, and various pieces of data 1107a may be loaded onto the processor 1103.

The wireless device 1101 may also include a transmitter 1111 and a receiver 1113 to allow transmission and reception of signals to and from the wireless device 1101. The transmitter 1111 and receiver 1113 may be collectively referred to as a transceiver 1115. An antenna 1117 may be electrically coupled to the transceiver 1115. The wireless device 1101 may also include multiple transmitters, multiple receivers, multiple transceivers and/or multiple antennas (not shown).

The various components of the wireless device 1101 may be coupled together by one or more buses, which may include a power bus, a control signal bus, a status signal bus, a data bus, etc. For the sake of clarity, the various buses are illustrated in FIG. 11 as a bus system 1119.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement (s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 9, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A circuit for a voltage controlled oscillator (VCO) buffer comprising:
   a first capacitor connected to an input of the VCO buffer, wherein the input is connected to a VCO core;
   a second capacitor connected to the input of the VCO buffer and the gate of a p-type metal-oxide-semiconductor field effect (PMOS) transistor;
   a first switch connected to the first capacitor and the gate of the PMOS transistor;
   a third capacitor connected to the input of the VCO buffer;
   a fourth capacitor connected to the input of the VCO buffer and the gate of an n-type metal-oxide-semiconductor field effect (NMOS) transistor; and
   a second switch connected to the third capacitor and the gate of the NMOS transistor.

2. The circuit of claim 1, wherein the first switch and the second switch are in the closed position when the amplitude of the input is less than a threshold amplitude.

3. The circuit of claim 1, wherein the first switch and the second switch are in the open position when the amplitude of the input is greater than a threshold amplitude.

4. The circuit of claim 1, wherein the source of the PMOS transistor is connected to a rail voltage and the drain of the PMOS transistor is connected to an output of the VCO buffer.

5. The circuit of claim 1, wherein the source of the NMOS transistor is connected to ground and the drain of the NMOS transistor is connected to an output of the VCO buffer.

6. The circuit of claim 1, wherein when the first switch and the second switch are in the open position, an input voltage to VCO buffer transistors is decreased.

7. The circuit of claim 1, wherein the first switch and the second switch are in the open position during a high VCO swing mode, and wherein an input voltage to VCO buffer transistors needs to be decreased during the high VCO swing mode.

8. The circuit of claim 1, wherein the first switch and the second switch are in the closed position during a low VCO swing mode, and wherein an input voltage to VCO buffer transistors does not need to be decreased during the low VCO swing mode.

9. The circuit of claim 1, wherein when the first switch is in the closed position, the first capacitor and the second capacitor are connected in parallel, creating a larger capacitance value between the input of the VCO buffer and the gate of the PMOS transistor, wherein a larger capacitance value between the input of the VCO buffer and the gate of the PMOS transistor creates a smaller voltage division resulting in a larger voltage swing at the gate of the PMOS transistor.

10. The circuit of claim 1, wherein when the first switch is in the open position, only the second capacitor is between the input of the VCO buffer and the gate of the PMOS transistor, wherein a smaller capacitance value between the input of the VCO buffer and the gate of the PMOS transistor creates a larger voltage division resulting in a smaller voltage swing at the gate of the PMOS transistor.

11. The circuit of claim 1, wherein when the second switch is in the closed position, the third capacitor and the fourth capacitor are connected in parallel, creating a larger capacitance value between the input of the VCO buffer and the gate of the NMOS transistor, wherein a larger capacitance value between the input of the VCO buffer and the gate of the NMOS transistor creates a smaller voltage division resulting in a larger voltage swing at the gate of the NMOS transistor.

12. The circuit of claim 1, wherein when the second switch is in the open position, only the fourth capacitor is between the input of the VCO buffer and the gate of the NMOS transistor, wherein a smaller capacitance value between the input of the VCO buffer and the gate of the NMOS transistor creates a larger voltage division resulting in a smaller voltage swing at the gate of the NMOS transistor.

13. The circuit of claim 1, wherein the first capacitor is larger than the second capacitor and the third capacitor is larger than the fourth capacitor.

14. The circuit of claim 1, further comprising:
a fifth capacitor connected to the gate of the PMOS transistor;
a third switch connected to the fifth capacitor and ground;
a sixth capacitor connected to the gate of the NMOS transistor; and
a fourth switch connected to the sixth capacitor and ground.

15. The circuit of claim 14, wherein when the third switch and the fourth switch are in the closed position, swing variation due to process variations in the first capacitor, the second capacitor, the third capacitor, the fourth capacitor, the NMOS transistor and the PMOS transistor is reduced.

16. The circuit of claim 14, wherein the third switch and the fourth switch are in the closed position when the amplitude of an oscillating voltage generated by the VCO core is greater than a threshold.

17. The circuit of claim 14, wherein the third switch and the fourth switch are in the open position when the amplitude of an oscillating voltage generated by the VCO core is less than a threshold.

18. The circuit of claim 14, wherein the third switch and the fourth switch are controlled by a comparator, wherein the comparator compares the amplitude of an oscillating voltage generated by the VCO core to a threshold to determine whether the third switch and the fourth switch are to be in the open or closed position.

19. The circuit of claim 1, wherein the first switch and the second switch are controlled by a comparator, wherein the comparator compares the amplitude of an oscillating voltage generated by the VCO core to a threshold to determine whether the first switch and the second switch are to be in the open or closed position.

20. A method for automatic control of a voltage controlled oscillator (VCO) buffer comprising:
generating an oscillating voltage using a VCO core;
determining an amplitude of the oscillating voltage using an amplitude detector;
comparing the amplitude of the oscillating voltage with a threshold amplitude using a comparator;
closing a first switch and a second switch in the VCO buffer when the amplitude of the oscillating voltage is less than the threshold amplitude;
opening the first switch and the second switch in the VCO buffer when the amplitude of the oscillating voltage is greater than the threshold amplitude;
opening a third switch and a fourth switch in the VCO buffer when the amplitude of the oscillating voltage is less than the threshold amplitude;
closing the third switch and the fourth switch in the VCO buffer when the amplitude of the oscillating voltage is greater than the threshold amplitude; and
generating an output voltage from the oscillating voltage using the VCO buffer.

21. The method of claim 20, wherein the voltage controlled oscillator (VCO) buffer comprises:
a first capacitor connected to an input of the VCO buffer, wherein the input is connected to the VCO core;
a second capacitor connected to the input of the VCO buffer and the gate of a p-type metal-oxide-semiconductor field effect (PMOS) transistor, wherein the first switch is connected to the first capacitor and the gate of the PMOS transistor;
a third capacitor connected to the input of the VCO buffer; and
a fourth capacitor connected to the input of the VCO buffer and the gate of an n-type metal-oxide-semiconductor field effect (NMOS) transistor, wherein the second switch is connected to the third capacitor and the gate of the NMOS transistor.

22. The method of claim 21, wherein the source of the PMOS transistor is connected to a rail voltage and the drain of the PMOS transistor is connected to an output of the VCO buffer.

23. The method of claim 21, wherein the source of the NMOS transistor is connected to ground and the drain of the NMOS transistor is connected to an output of the VCO buffer.

24. The method of claim 21, wherein when the first switch is in the closed position, the first capacitor and the second capacitor are connected in parallel, creating a single larger capacitance value between the input of the VCO buffer and the gate of the PMOS transistor, wherein a larger capacitance value between the input of the VCO buffer and the gate of the PMOS transistor creates a smaller voltage division resulting in a larger voltage swing at the gate of the PMOS transistor.

25. The method of claim 21, wherein when the first switch is in the open position, only the second capacitor is between the input of the VCO buffer and the gate of the PMOS transistor, wherein a smaller capacitance value between the input of the VCO buffer and the gate of the PMOS transistor creates a larger voltage division resulting in a smaller voltage swing at the gate of the PMOS transistor.

26. The method of claim 21, wherein when the second switch is in the closed position, the third capacitor and the fourth capacitor are connected in parallel, creating a larger capacitance value between the input of the VCO buffer and the gate of the NMOS transistor, wherein a larger capacitance value between the input of the VCO buffer and the gate of the NMOS transistor creates a smaller voltage division resulting in a larger voltage swing at the gate of the NMOS transistor.

27. The method of claim 21, wherein when the second switch is in the open position, only the fourth capacitor is between the input of the VCO buffer and the gate of the NMOS transistor, wherein a smaller capacitance value between the input of the VCO buffer and the gate of the NMOS transistor creates a larger voltage division resulting in a smaller voltage swing at the gate of the NMOS transistor.

28. The method of claim 21, wherein the first capacitor is larger than the second capacitor and the third capacitor is larger than the fourth capacitor.

29. The method of claim 21, further comprising:
a fifth capacitor connected to the gate of the PMOS transistor;

a third switch connected to the fifth capacitor and ground;
a sixth capacitor connected to the gate of the NMOS transistor; and
a fourth switch connected to the sixth capacitor and ground.

30. The method of claim 29, wherein when the third switch and the fourth switch are in the closed position, swing variation due to process variations in the first capacitor, the second capacitor, the third capacitor, the fourth capacitor, the NMOS transistor and the PMOS transistor is reduced.

31. The method of claim 29, wherein the third switch and the fourth switch are controlled by the comparator, wherein the comparator compares the amplitude of the oscillating voltage generated by the VCO core to the threshold to determine whether the third switch and the fourth switch are to be in the open or closed position.

32. The method of claim 20, further comprising applying the oscillating voltage to VCO buffer transistors.

33. The method of claim 32, wherein when the first switch and the second switch are in the open position, the oscillating voltage applied to the VCO buffer transistors is decreased.

34. The method of claim 20, wherein the first switch and the second switch are in the open position during a high VCO swing mode, and wherein an input voltage to VCO buffer transistors needs to be decreased during the high VCO swing mode.

35. The method of claim 20, wherein the first switch and the second switch are in the closed position during a low VCO swing mode, and wherein an input voltage to VCO buffer transistors does not need to be decreased during the low VCO swing mode.

36. The method of claim 20, wherein the first switch and the second switch are controlled by the comparator, wherein the comparator compares the amplitude of the oscillating voltage generated by the VCO core to the threshold to determine whether the first switch and the second switch are to be in the open or closed position.

37. A wireless device having a voltage controlled oscillator (VCO) buffer, comprising:
means for generating an oscillating voltage;
means for determining an amplitude of the oscillating voltage;
means for comparing the amplitude of the oscillating voltage with a threshold amplitude;
means for closing a first switch and a second switch in the VCO buffer when the amplitude of the oscillating voltage is less than the threshold amplitude;
means for opening the first switch and the second switch in the VCO buffer when the amplitude of the oscillating voltage is greater than the threshold amplitude;
means for opening a third switch and a fourth switch in the VCO buffer when the amplitude of the oscillating voltage is less than the threshold amplitude;
means for closing the third switch and the fourth switch in the VCO buffer when the amplitude of the oscillating voltage is greater than the threshold amplitude; and
means for generating an output voltage from the oscillating voltage using the VCO buffer.

38. A computer-program product for a voltage controlled oscillator (VCO) buffer, the computer-program product comprising a non-transitory computer-readable medium having executable instructions thereon, the instructions comprising:
code for generating an oscillating voltage using a VCO core;
code for determining an amplitude of the oscillating voltage using an amplitude detector;
code for comparing the amplitude of the oscillating voltage with a threshold amplitude using a comparator;
code for closing a first switch and a second switch in the VCO buffer when the amplitude of the oscillating voltage is less than the threshold amplitude;
code for opening the first switch and the second switch in the VCO buffer when the amplitude of the oscillating voltage is greater than the threshold amplitude;
code for opening a third switch and a fourth switch in the VCO buffer when the amplitude of the oscillating voltage is less than the threshold amplitude;
code for closing the third switch and the fourth switch in the VCO buffer when the amplitude of the oscillating voltage is greater than the threshold amplitude; and
code for generating an output voltage from the oscillating voltage using a VCO buffer.

* * * * *